United States Patent
Park

(10) Patent No.: US 9,362,469 B2
(45) Date of Patent: Jun. 7, 2016

(54) LIGHT EMITTING PACKAGE HAVING A GUIDING MEMBER GUIDING AN OPTICAL MEMBER

(71) Applicant: LG INNOTEK CO., LTD., Seoul (KR)

(72) Inventor: Jun Seok Park, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/975,030

(22) Filed: Dec. 18, 2015

(65) Prior Publication Data

US 2016/0104826 A1    Apr. 14, 2016

Related U.S. Application Data

(63) Continuation of application No. 14/507,560, filed on Oct. 6, 2014, now Pat. No. 9,240,534, which is a continuation of application No. 14/066,468, filed on Oct. 29, 2013, now Pat. No. 8,878,200, which is a (Continued)

(30) Foreign Application Priority Data

Dec. 17, 2004  (KR) .................. 10-2004-0107782

(51) Int. Cl.
| | |
|---|---|
| H01L 23/053 | (2006.01) |
| H01L 33/58 | (2010.01) |
| H01L 33/56 | (2010.01) |
| H01L 33/62 | (2010.01) |
| H01L 33/40 | (2010.01) |

(52) U.S. Cl.
CPC ............. *H01L 33/56* (2013.01); *H01L 33/40* (2013.01); *H01L 33/58* (2013.01); *H01L 33/62* (2013.01)

(58) Field of Classification Search
CPC .............................. H01L 33/60; H01L 23/053
See application file for complete search history.

(56) References Cited

U.S. PATENT DOCUMENTS

| | | | |
|---|---|---|---|
| 4,767,674 A | 8/1988 | Shirai et al. | |
| 5,298,768 A | 3/1994 | Okazaki et al. | |
| 5,994,212 A | 11/1999 | Arakawa et al. | |

(Continued)

FOREIGN PATENT DOCUMENTS

| | | |
|---|---|---|
| EP | 0525644 A1 | 2/1993 |
| EP | 1467414 A1 | 10/2004 |

(Continued)

OTHER PUBLICATIONS

Machine English translation of JP-08-008463.

(Continued)

*Primary Examiner* — Thanh V Pham
(74) *Attorney, Agent, or Firm* — Birch, Stewart, Kolasch & Birch, LLP

(57) ABSTRACT

A light emitting package, includes a base; a light emitting device on the base; an electrical circuit layer electrically connected to the light emitting device; an optical member formed of a light transmissive material; and a guiding member guiding the optical member, the guiding member including an opening, a first portion disposed on the uppermost surface of the base, and a second portion connected to an edge portion of the optical member. The first portion of the guiding member is positioned higher than a bottom surface of the optical member, an uppermost surface of the base is closer to the first portion of the guiding member than the second portion of the guiding member, and the edge portion of the optical member is closer to the second portion of the guiding member than the first portion of the guiding member.

20 Claims, 5 Drawing Sheets

Related U.S. Application Data continuation of application No. 13/892,814, filed on May 13, 2013, now Pat. No. 8,598,601, which is a continuation of application No. 13/651,110, filed on Oct. 12, 2012, now Pat. No. 8,445,922, which is a continuation of application No. 13/399,709, filed on Feb. 17, 2012, now Pat. No. 8,378,360, which is a continuation of application No. 13/182,393, filed on Jul. 13, 2011, now Pat. No. 8,138,507, which is a continuation of application No. 13/036,947, filed on Feb. 28, 2011, now Pat. No. 8,003,997, which is a continuation of application No. 12/860,792, filed on Aug. 20, 2010, now Pat. No. 7,977,684, which is a continuation of application No. 10/578,150, filed as application No. PCT/KR2005/002368 on Jul. 21, 2005, now Pat. No. 7,821,020.

(56) References Cited

U.S. PATENT DOCUMENTS

| | | | |
|---|---|---|---|
| 6,249,267 | B1 | 6/2001 | Ishihara |
| 6,809,261 | B1 | 10/2004 | Ng et al. |
| 6,936,855 | B1 | 8/2005 | Harrah |
| 2002/0163001 | A1 | 11/2002 | Shaddock |
| 2004/0061120 | A1 | 4/2004 | Mizuyoshi |
| 2004/0065894 | A1 | 4/2004 | Hashimoto et al. |
| 2004/0095738 | A1 | 5/2004 | Juang |
| 2004/0099874 | A1 | 5/2004 | Chang et al. |
| 2004/0222433 | A1 | 11/2004 | Mazzochette et al. |

FOREIGN PATENT DOCUMENTS

| | | |
|---|---|---|
| JP | 8-008463 A | 1/1996 |
| JP | 8-18182 A | 1/1996 |
| JP | 9-223820 A | 8/1997 |
| JP | 10-012927 A | 1/1998 |
| JP | 2003-008073 A | 1/2003 |
| JP | 2004-39691 A | 2/2004 |
| JP | 2004-311791 A | 11/2004 |

OTHER PUBLICATIONS

Machine English translation of JP-10-012927.
Machine English translation of JP-2003-008073.
Machine English translation of JP-2004-039691.
Machine English translation of JP-2004-311791.
Machine Generated Translation for JP8-18182A.

LIGHT EMITTING PACKAGE HAVING A GUIDING MEMBER GUIDING AN OPTICAL MEMBER

CROSS REFERENCE TO RELATED APPLICATIONS

This application is a continuation of application Ser. No. 14/507,560, filed on Oct. 6, 2014, which is a continuation of application Ser. No. 14/066,468, filed on Oct. 29, 2013 (now U.S. Pat. No. 8,878,200, issued on Nov. 4, 2014), which is a continuation of application Ser. No. 13/892,814, filed on May 13, 2013 (now U.S. Pat. No. 8,598,601, issued on Dec. 3, 2013), which is a continuation of application Ser. No. 13/651,110, filed on Oct. 12, 2012 (now U.S. Pat. No. 8,445,922, issued on May 21, 2013), which is a continuation of application Ser. No. 13/399,709, filed on Feb. 17, 2012 (now U.S. Pat. No. 8,378,360, issued on Feb. 19, 2013), which is a continuation of application Ser. No. 13/182,393, filed on Jul. 13, 2011 (now U.S. Pat. No. 8,138,507, issued on Mar. 20, 2012), which is a continuation of application Ser. No. 13/036,947, filed on Feb. 28, 2011 (now U.S. Pat. No. 8,003,997, issued on Aug. 23, 2011), which is a continuation of application Ser. No. 12/860,792, filed on Aug. 20, 2010 (now U.S. Pat. No. 7,977,684, issued on Jul. 12, 2011), which is a continuation of application Ser. No. 10/578,150, filed on May 3, 2006 (now U.S. Pat. No. 7,821,020, issued on Oct. 26, 2010), which is the national phase of PCT international Application No. PCT/KR2005/002368 filed on Jul. 21, 2005, and which claims priority to Korean Patent Application No. 10-2004-0107782, filed on Dec. 17, 2004. The entire contents of all of the above applications are hereby incorporated by reference.

TECHNICAL FIELD

The present invention relates to a light emitting device package, and more particularly, to a light emitting device package, which is excellent in heat radiation performance and allows circuit design for control of light emission of a semiconductor light emitting device to be freely done.

BACKGROUND ART

Generally, as a semiconductor light emitting device, a LED (Light Emitting Diode) can be included, which is a device used for converting electrical signals in the form of infrared, visible and ultraviolet light to emit light by using the characteristics of compound semiconductor.

As for the range of use of LEDs, LEDs are usually used for home appliances, remote controllers, electric signs, displays, a variety of automation equipment, etc., and roughly divided into IRED (Infrared Emitting Diode) and VLED (Visible Light Emitting Diode). The structure of the above-said LED is as follows in general.

Generally, in a blue LED, a N type GaN layer is formed on a sapphire substrate, N-metal is formed on one side of the surface of the N type GaN layer, and an active layer is formed on the portions except for the region where the N-metal is formed. And, a P type GaN layer is formed on the active layer, and P-metal is formed on the P type GaN layer. The active layer is a layer that generates light by holes flowing through the P-metal and electrons flowing through the N-metal being combined to each other.

The aforementioned LED is used for home appliances, electric signs and the like according to the intensity of light output. Especially, LEDs have a tendency to become slimmer as information communication equipment are getting smaller in size, and peripheral equipment, such as resistors, condensers, noise filters, etc., are getting much smaller.

Consequently, light emitting devices are packaged in a surface mount device (hereinafter, "SMD") type so that the light emitting device can be directly mounted to a PCB (Printed Circuit Board). Accordingly, LED lamps used as a display device are also being developed in a SMD type.

Such a SMD can substitute an existing simple lighting lamp, and used for lighting displays, character displays, image displays, etc. that produces variety of colors.

As above, as the range of use of LEDs has been becoming wider, a required luminescence is becoming higher and higher, like in lamps used for daily life, rescue signaling lamps and the like. Thus, high output LEDs have been widely used in recent years.

FIG. 1 is an explosive perspective view of a structure of a light emitting device package according to the prior art.

As shown therein, in the structure of the light emitting device package 100 according to the prior art, electrode lead frames 130 for applying power to a light emitting device from an external PCB are respectively formed and arranged on a package body 120.

A lens 110 is attached on top of the package body 120 in order to improve the light efficiency of light generated from a LED 140 used as the light emitting device.

An assembly having the LED 140 mounted therein is combined to the bottom of the package body 120. Firstly, a reflecting cup 160 with a high light reflectivity is combined onto an electrical conductor 170. The LED 140 is mounted on a sub mount 150 formed of silicon by flip chip bonding or wire bonding. Though not shown, a reflecting hole is formed inside the sub mount by etching the sub mount 150, a reflective layer is formed on the reflecting hole, and then the LED 140 is mounted.

When the LED 140 is mounted on the sub mount 150, the sub mount 150 is mounted on the reflecting cup 160 formed on the conductor 170, and then an electrical connection process with the electrode lead frames 130 of the LED body 120 is carried out so as to apply power.

The light emitting device package 100 thus assembled reflects the light generated from the LED 140 against the reflecting cup 160, and then diffuses the light to outside via the lens 110.

FIG. 2 is a view showing light emitting device packages 100a, 100b and 100c according to the prior art provided in plural number on a circuit substrate 200.

According to FIG. 2, unlike the light emitting device package presented in FIG. 1, a plurality of LEDs 100a, 100b and 100c are used integrally, in which they are provided in three colors of red, green and blue, respectively and lead frames 130a, 130b and 130c are respectively bonded onto the circuit substrate 200 by a solder 180.

However, the light emitting device package 100 having the aforementioned structure has a problem that if the intensity of current is increased in order to obtain light having a high output, a high temperature heat is generated due to poor heat radiation performance in the package. In a case where the high temperature heat exists in the package without being radiated, the resistance becomes very high and thus the light efficiency becomes deteriorated.

Further, the prior art light emitting device package 100 has a drawback that because the conductor 170, reflecting cup 160, package body 120 and the like are separated from each other, the heat generated from the LED is not easily transferred to outside due to a high heat resistance of their contact portions.

Further, there is an inconvenience that since only one LED is mounted in the package body 120, three light emitting device packages must be placed in a set in order to display high output white. In this case, there is another drawback that the control circuit becomes complex and the volume becomes larger.

Further, in the plurality of single unit type light emitting device packages 100*a*, 100*b* and 100*c* combined to each other, the surface area of the entire substrate 200 is increased so as to connect electrodes from outside, thus increasing the cost of the assembling process.

Further, the structure of the prior art light emitting device package 100 has a problem not only in terms of heat radiation but also in terms of structure. Specifically, there is a problem that colors cannot be mixed on an ideal point light source due to the characteristics of RGB color mixing since air bubbles may be formed upon molding and the single unit type light emitting device packages are arranged on a wide surface area. Besides, there is a problem that the thickness of the lens to be mounted becomes larger due to the arrangement of an electrode, insulating layer, molding space and LED.

DISCLOSURE

Technical Problem

The present invention is directed to solve the aforementioned problems, and it is an object of the present invention to provide a light emitting device package, which is improved in heat conductivity by eliminating the structure obstructing the heat radiation of a light emitting device from a multilayered mounting structure when directly mounting the light emitting device on a metal PCB.

Furthermore, it is another object of the present invention to provide a light emitting device package, in which each component of a light emitting device is built in respective modules and mounted and a plurality of light emitting device packages are efficiently arranged on a metal PCB, and which makes circuit configuration easier, when directly mounting the light emitting device on the metal PCB.

Furthermore, it is yet another object of the present invention to provide a light emitting device package, which improves a metal PCB structure and a molding structure so as to minimize the thickness of a lens in preparing a lens for the distribution of light and minimizes the rejection rate caused by air bubbles generated during a molding process.

Technical Solution

To achieve the above objects, there is provided a light emitting device package according to the present invention, comprising: a metal base; an electrical circuit layer provided at an upper side of the metal base for providing a conductive path; an insulating layer sandwiched between the meta base and the electrical circuit layer; a light emitting device mounted on the top surface of the metal base in an open space from which the insulating layer is removed; an electrode layer provided at an upper side of the electrical circuit layer; and a connection portion for electrically connecting the electrode layer and the light emitting device.

Additionally, there is provided a light emitting device package according to another aspect of the present invention, comprising: a metal base; an electrical circuit layer provided at an upper side of the metal base for providing a conductive path; a light emitting device mounted in a second region having a smaller thickness than a first region on the metal base; an insulating layer sandwiched between the meta base and the electrical circuit layer; an electrode layer provided at an upper side of the electric circuit layer; and a connection portion for electrically connecting the electrode layer and the light emitting device.

Advantageous Effects

According to the present invention, because heat generated from inside the light emitting device package can be efficiently released, as many high output light emitting devices as possible can be arranged in various forms in a restricted space within the package. Thus, the light emitting device package can be utilized in various ways for light emitting device applications having a tendency to be decreased in size.

Additionally, according to the present invention, the manufacturing cost can be cut down, and the process can be minimized. Besides, excellent characteristics can be obtained uniformly in terms of heat radiation, optics with high light collectivity, mechanics, product reliability, etc.

DESCRIPTION OF DRAWINGS

The present invention will be more fully understood by reference to the accompanying drawings, in which.

BEST MODE

Hereinafter, a light emitting device package according to preferred embodiments of the present invention will be described in detail with reference to the accompanying drawings.

First Embodiment

Figure 1:
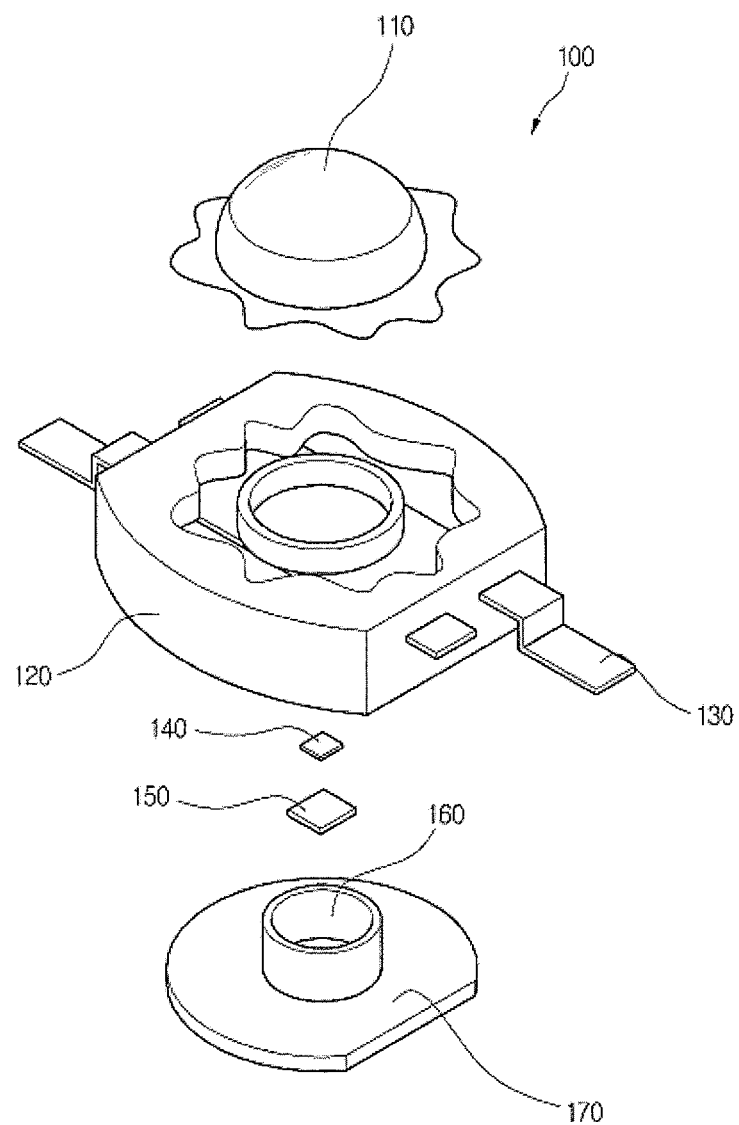
FIG. 1 is an explosive perspective view of a structure of a light emitting device package according to the prior art.
Figure 2:
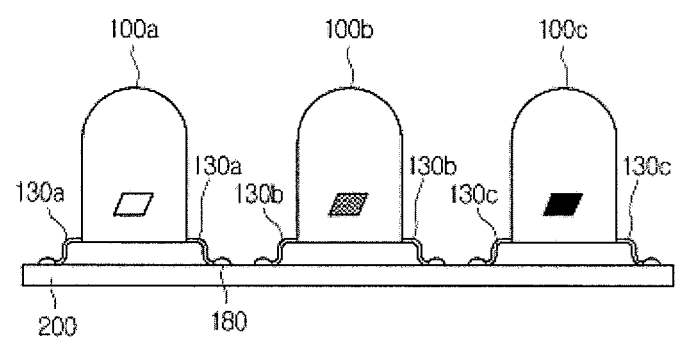
FIG. 2 is a view showing light emitting device packages according to the prior art provided in plural number on a circuit substrate.
Figure 3:
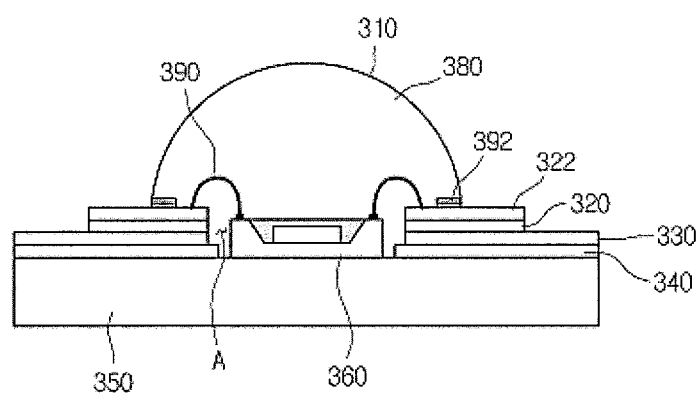
FIG. 3 is a cross sectional view of a light emitting device package according to a first embodiment of the present invention.

FIG. 3 is a cross sectional view of a light emitting device package according to a first embodiment of the present invention Referring to FIG. 3, the light emitting device package according to a first embodiment of the present invention comprises a lens portion 310, a silk screen layer 392, a light emitting device 360, an electrode layer 320, an electrical circuit layer 330, an insulating layer 340, and a metal base 350.

Firstly, the metal base 350 is the lowermost layer of a metal PCB, and functions to mount other components on its top layer and support them, and release heat generated from the light emitting device 360 toward the bottom surface. The metal base 350 can be combined to a heat sink further provided on its bottom surface. It is preferable that the heat sink and the metal base 350 each form a fastening hole and are combined to each other by screw type fastening.

Additionally, if a heat transfer material is applied or provided on the combining surface between the metal base 350 and the heat sink, the heat radiation effect can be further maximized.

The insulating layer 340 electrically insulates between the electrical circuit layer 330 and the metal base 350 so that currents flowing in the electrical circuit layer 330 cannot flow toward the metal base 350. This, however, becomes an obstruction for an efficient heat radiation because the insulating layer 340 performs the function of insulation while simultaneously serving as a heat resistor.

Therefore, in the first embodiment of the present invention, the insulating layer 340 is removed at least at the portion where the light emitting device 360 is placed. That is, since the electrode structure of the light emitting device 360 is formed upward, it only needs to be physically combined without help from the insulating layer 340.

In order for the surface where the light emitting device 360 is placed to be removed, the insulating layer 340 may be processed by milling or etching. And, the light emitting device 360 is combined by a bonding member, such as a heat conductive hardening agent, when it is mounted on the metal base 350.

The electrically circuit layer 330 is placed on the top of the insulating layer 340. In the light emitting device package according to the first embodiment of the present invention, since light emitting devices 360 built in respective modules may be provided in plural number, the electrical circuit layer 330 consists of a plurality of circuits for applying electricity to the light emitting devices 360. Like the insulating layer 340, the electrical circuit layer 330 is removed at the portions where the light emitting devices 360 are placed.

As described above, since the light emitting devices 360 are provided in plurality numbers on one metal base 350, it is advantageous to construct the electrical circuit layer 330 as a serially connected circuit on one module for the sake of circuit design or package application.

The electrode layer 320 for energizing the light emitting devices 360 is positioned at the tip end of the electrical circuit layer 330, from which the portions where the light emitting devices 360 are positioned are removed, and connected to a wire 390. Thus, in the first embodiment of the present invention, it can be known that the electrode layer 320 serves as a prior art lead frame. The wire 390 performs the function of electrically connecting the light emitting devices and the electrode layer.

Besides, the electrode layer 320 is generally made of metal, such as nickel, and a plating layer 322 is provided on the top surface thereof in order to improve the electric conductivity. Preferably, the plating layer 322 is formed of gold at a thickness of 0.3 mm or more through an electrolytic plating method. In such a structure, the electrical circuit layer 330 and the electrode layer 320 whose top surface is plated are preferably formed in a manner that the sum of the thickness of the two layers is within 200 mm.

The light emitting device 360 is provided with a light emitting portion made of a compound semiconductor and an electrode for applying current, and when a power is applied from the electrode layer 320, light emission is performed. As the light emitting device, a light emitting diode is preferably exemplified.

As made clear by the aforementioned structure, the light emitting device 360 can be directly mounted on the metal base 350 by being embedded in an opening space A of the insulating layer 340, electrical circuit layer 330 and electrode layer 320.

As the light emitting device 360, can be included a SiOB (Silicon Optical Bench) chip, a red LED chip, a green LED chip, a blue LED chip, a yellow LED chip, an orange LED chip, etc. Especially, the SiOB chip denotes a chip that is made by etching a cup-shaped space into a silicon substrate and mounting a LED in the space. The silicon substrate may be made of other material.

The electrode layer 320 has a silk screen layer 392 formed at an outer side of the portion to be bonded by the electrode of the light emitting device 360 and the wire 390. The lens portion 310 is attached to the silk screen layer 392. The lens portion 310 can be provided by a molding portion 380 where a transparent resin material is to be molded, and the molding portion 380 can be molded at a precise position by a procedure of attaching to the silk screen layer 392.

Figure 4:
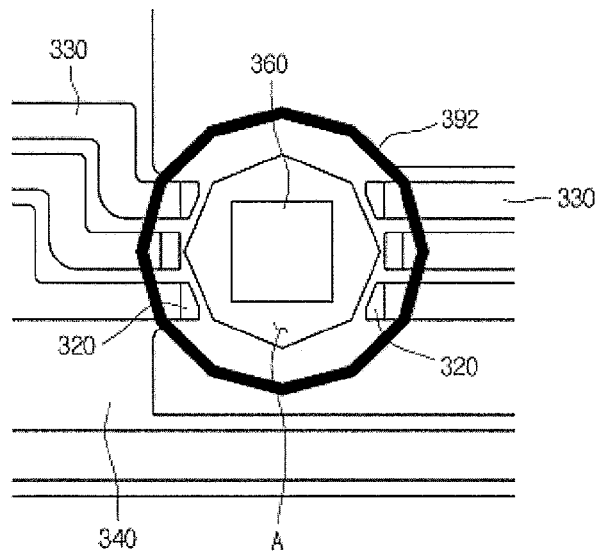
FIG. 4 is a plan view of the light emitting device package according to the first embodiment of the present invention.

FIG. 4 is a plan view of the light emitting device package according to the first embodiment of the present invention, especially, in which the shape of the silk screen layer is clearly illustrated. But, the wire is very small and thus not shown, and it is needless to say that a plurality of chips can be mounted simultaneously on the light emitting device 360.

Referring to FIG. 4, to protect the light emitting device 360 and the wire 390, the internal space of the molding space 380 constituting the lens portion 310 is molded from the upper surface of the metal base 350 at a height larger than that of the portion where the wire 390 is placed, especially, it is molded using a synthetic resin material such as epoxy or silicon. The molding portion 380 is a kind of high refractive filler material, and uniformly distributes the light diffused by the light emitting device 360.

As seen from above, the light emitting device package according to the first embodiment of the present invention has a merit that it is reduced in size, is freely arranged and can be built in respective modules with the improvement of heat radiation effect since a reflecting cup, a lead frame and a lens portion of the prior art light emitting device package are integrated and mounted on a metal PCB.

Second Embodiment

In explaining the second embodiment of the present invention, many parts of the foregoing description of the first embodiment of the present invention are incorporated. Hereinafter, only characteristically different portions will be described in detail.

Figure 5:
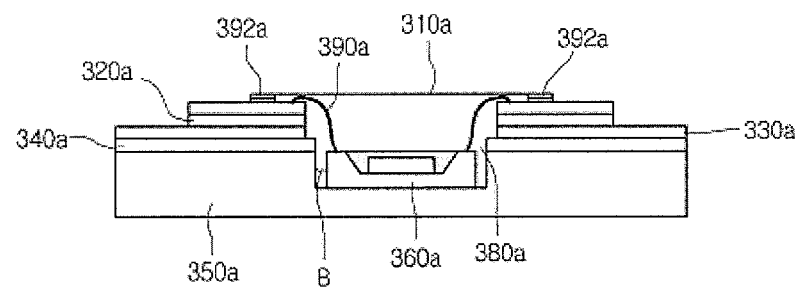
FIG. 5 is a cross sectional view showing an internal structure of a light emitting device package according to a second embodiment of the present invention.

FIG. 5 is a cross sectional view showing an internal structure of a light emitting device package according to a second embodiment of the present invention.

Referring to FIG. 5, the light emitting device package according to a second embodiment of the present invention comprises a lens portion 310a, a silk screen layer 392a, a light emitting device 360a, an electrode layer 320a, an electrical circuit layer 330a, an insulating layer 340a, a wire 390a and a metal base 350. The functions, structure and material of the lens portion 310a, silk screen layer 392a, light emitting device 360a, electrode layer 320a, electrical circuit layer 330a and insulating layer 340a are similar to those of the first embodiment of the present invention.

The only difference from the first embodiment is that only parts of the metal base 350a are removed in the region where the light emitting device 360a is placed, and the light emitting device 360a is placed in a removal region B from which the metal base 350a is removed.

More specifically, the removal region B can be processed by a given processing method such as milling or the like. As the light emitting device 360a is embedded in the removal region B, the top surface of the lens portion 310a establishes equilibrium, and the overall height of the lens portion can become smaller than in the first embodiment. Besides, the light emitting device 360a is inserted into the removal region B, thus allowing the bottom surface to be attached by a thermal conductive hardening agent.

The light emitting device 360a mounted in the removal region B is energized by the electrode layer 320a and the wire 390a positioned relatively higher than the light emitting device 360. Like in the first embodiment of the present invention, a molding portion 380a is provided in order to protect the light emitting device 360a and the wire 390a.

At this time, the molding portion 380 is also relatively low in height, which is possible because the light emitting device 360a is inserted and placed in the metal base 350a, and the space for bonding the wire 390a is also placed at a relatively lower side. In the second embodiment of the present invention, it is preferable that the molding portion 380a is formed at such a height as to protect the light emitting device 360a and the bonding portion 390a.

By such a structure, the thickness of the lens portion 310 can be smaller, and furthermore the highest side of the lens portion 310a can be planarized and reduced in height, thus enabling it to use various kinds of lenses including a Fresnel lens.

Moreover, a molding member of a synthetic resin material such as epoxy or silicon is directly injected into the recess of the metal base 350a, and thus there is no need to use a gap for injecting the molding member as in the prior art. By this, air bubbles can be prevented from generation upon molding.

As explained above, the position of the light emitting device 360a, the structure of the molding portion 380a and a decrease of the lens thickness allows red, green and blue to be mixed with each other on much smaller regions, thereby making a finally diffused light come close to a point source of light.

Moreover, the removal region B may be formed in a cylindrical recess, or the sides of the cylindrical recess B may be formed inclined at a predetermined angle. The inner surface of the recess B forming the predetermined angle can increase the reflection efficiency of light. Furthermore, it is preferable that the sides of the recess B are gloss coated or provided with a reflection material so as to improve the reflectivity. Namely, in a case where the light emitting device 360a light emits within the cylindrical recess B, the inclined surface of the metal base 350a reflects almost all of the light upward, and thus the light emission efficiency of the light emitting device 360 can be increased.

Third Embodiment

The third embodiment of the present invention is characterized in that it proposes an overall structure in which the light emitting package proposed in the first and second embodiments is used as a single unit.

Figure 6:
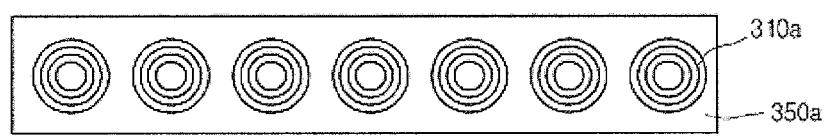
FIGS. 6, 7, 8 and 9 are views showing light emitting device packages arranged on a single metal base in a straight line, a round, a square and a hexagon.

Referring to FIG. 6, according to this embodiment, a plurality of light emitting device packages are provided on one metal base 350a, and lens portions 310a are respectively arranged on the light emitting device packages. Of course, it is possible to mount high output light emitting device packages in a smaller space by the electrical circuit layer 330a having a circuit for connecting the respective light emitting device packages. In the drawing, it is shown that the light emitting device packages are arranged in a straight line. That is, a plurality of light emitting device modules provided by the respective light emitting devices is arranged in a straight line.

In this case, in the first and second embodiments of the present invention, the metal PCB may have a reflection material on the surface of the layer open to the top surface out of the electrical circuit layers 330 and 330a, electrode layers 320 and 320a, insulating layers 340 and 340a and metal bases 350 and 350a, or may be gloss coated. By the reflection material or gloss-coating, the light emitted from the light emitting devices 360 and 360a provided in plural number have a high reflection efficiency even on the metal PCB outside the lens portions 310 and 310a.

Moreover, in the drawing, the portions indicated in round exemplify the shape of a Fresnel lens serving as the lens portion 310a, and the mounting surface is indicated in a simplified form by the metal base 350a.

Figure 7:
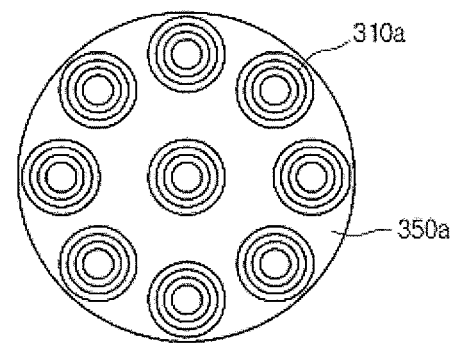
Figure 8:
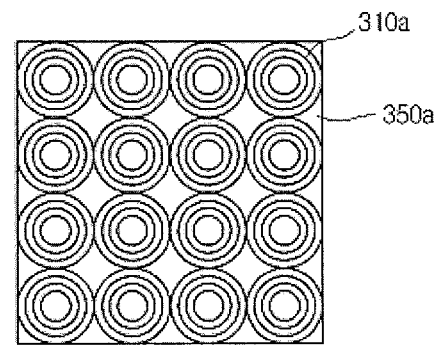
Figure 9:
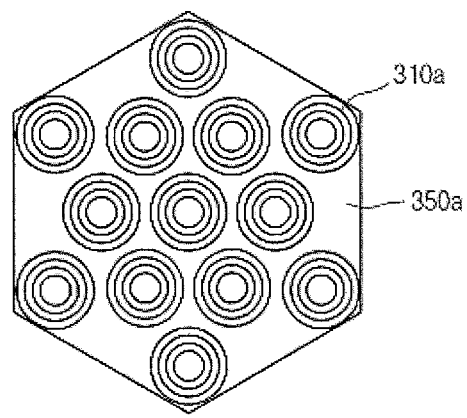

FIGS. 7, 8 and 9 show another embodiments in which light emitting device packages on a single metal base 350a can be arranged in a round shape, a square shape and a hexagonal shape, respectively. These arrangements of the light emitting device packages may change according to specific uses for applying light emitting devices.

Figure 10:
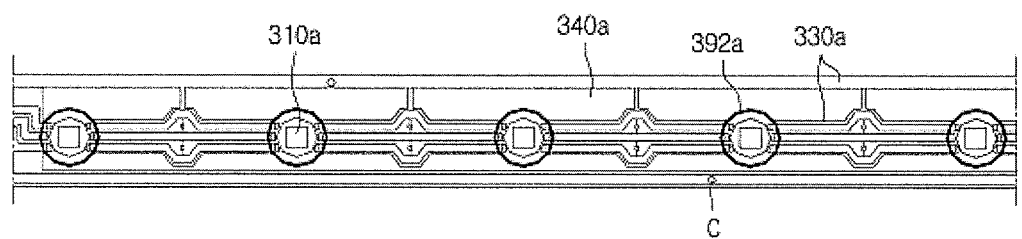
FIG. 10 is an enlarged view of the light emitting device packages according to the embodiments of the present invention arranged in a straight line.

FIG. 10 is an enlarged view of the light emitting device packages according to the embodiments of the present invention arranged in a straight line.

Referring to FIG. 10, in the electrical circuit layer 330a, it can be seen that the respective light emitting device packages indicated as the silk screen layer 392a on the insulating layer 340a are supplied with power so that the plurality of light emitting device packages may be energized simultaneously through a serial connection circuit. Of course, it is also possible to supply power to the respective light emitting devices of green, red and blue by providing a plurality of serial connection circuits.

Meanwhile, a fastening hole C of the metal base 350a is a hole for combining via a heat sink and a screw type fastening structure in a case where an additional heat sink is secondarily provided on the metal base 350a as explained in the first embodiment of the present invention.

MODE FOR INVENTION

The light emitting device package according to the present invention proposes a configuration for emitting a high output light, and is primarily focused on an arrangement structure of light emitting devices. To achieve the aforementioned objects, the present invention may be practiced in a variety of embodiments without departing from the foregoing embodiments, and such embodiments may be construed as within the spirit and scope of the present invention.

INDUSTRIAL APPLICABILITY

According to the light emitting package of the present invention, because heat generated from inside the light emitting device package can be efficiently released, as many high output light emitting devices as possible can be arranged in various forms in a restricted space, and thus, the light emitting device package can be utilized in various ways for products with a tendency to be decreased in size.

Additionally, according to the present invention, the manufacturing cost can be cut down, and the process can be minimized since light emitting device packages built in respective modules can be integrated and mounted through a structural improvement without having a radiator.

Besides, according to the present invention, it is possible to obtain a light emitting device package having excellent characteristics uniformly in terms of heat radiation, optics with high light collectivity, mechanics, product reliability, etc.

What is claimed is:

1. A light emitting package, comprising:
    a base having an uppermost surface with a first flat portion and a recess with a second flat portion;
    a light emitting device disposed on the base;
    an electrical circuit layer electrically connected to the light emitting device;
    an optical member formed of a light transmissive material such that light emitted from the light emitting device passes therethrough; and
    a guiding member guiding the optical member, the guiding member including an opening and a first portion disposed on the uppermost surface of the base around the light emitting device,
    wherein the first portion of the guiding member is provided higher than a bottom surface of the optical member,
    wherein a top surface of the optical member is parallel to the first flat portion and the second flat portion of the base,
    wherein the uppermost surface of the base is positioned higher than the bottom surface of the optical member, and
    wherein the light emitting device is disposed on the recess that is a lowermost top surface of the base.

2. The light emitting package of claim 1, wherein the optical member is connected to the guiding member.

3. The light emitting package of claim 1, wherein the uppermost surface of the base and the first portion of the guiding member are vertically overlapped with respect to each other.

4. The light emitting package of claim 1, wherein a bottom surface of the first portion is positioned higher than the bottom surface of the optical member.

5. The light emitting package of claim 1, wherein a shape of the opening of the guiding member is substantially circular.

6. The light emitting package of claim 1, wherein the optical member covers the light emitting device.

7. The light emitting package of claim 1, further comprising an electrode layer disposed on the electrical circuit layer.

8. The light emitting package of claim 7, wherein the electrode layer includes nickel.

9. The light emitting package of claim 7, wherein the electrode layer includes gold.

10. The light emitting package of claim 1, wherein the optical member is formed of a resin material.

11. A light emitting unit, comprising:
    at least one light emitting package, each including:
    a base having an uppermost surface with a first flat portion and a recess with a second flat portion;
    a light emitting device disposed on the base;
    an electrical circuit layer electrically connected to the light emitting device;
    an optical member formed of a light transmissive material such that light emitted from the light emitting device passes therethrough; and
    a guiding member guiding the optical member, the guiding member including an opening and a first portion disposed on the uppermost surface of the base around the light emitting device,
    wherein the first portion of the guiding member is provided higher than a bottom surface of the optical member,
    wherein a top surface of the optical member is parallel to the first flat portion and the second flat portion of the base,
    wherein the uppermost surface of the base is positioned higher than the bottom surface of the optical member, and
    wherein the light emitting device is disposed on the recess that is a lowermost top surface of the base.

12. The light emitting unit of claim 11, wherein the optical member is connected to the guiding member.

13. The light emitting unit of claim 11, wherein the uppermost surface of the base and the first portion of the guiding member are vertically overlapped with respect to each other.

14. The light emitting unit of claim 11, wherein a bottom surface of the first portion is positioned higher than the bottom surface of the optical member.

15. The light emitting unit of claim 11, wherein a shape of the opening of the guiding member is substantially circular.

16. The light emitting unit of claim 11, wherein the optical member covers the light emitting device.

17. The light emitting unit of claim 1, further comprising an electrode layer disposed on the electrical circuit layer.

18. The light emitting unit of claim 17, wherein the electrode layer includes nickel.

19. The light emitting unit of claim 17, wherein the electrode layer includes gold.

20. The light emitting unit of claim 11, wherein the optical member is formed of a resin material.

* * * * *